(12) United States Patent
Whiteman et al.

(10) Patent No.: US 7,243,776 B2
(45) Date of Patent: Jul. 17, 2007

(54) LOADING AND EXTRACTION OF MODULAR BELT CARRIERS OF ELECTRONIC COMPONENTS

(75) Inventors: Kenneth S. Whiteman, Portland, OR (US); John D. Stackpole, Klamath Falls, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 261 days.

(21) Appl. No.: 10/989,904

(22) Filed: Nov. 15, 2004

(65) Prior Publication Data

US 2005/0166840 A1   Aug. 4, 2005

Related U.S. Application Data

(62) Division of application No. 10/642,052, filed on Aug. 15, 2003, now Pat. No. 7,066,314.

(60) Provisional application No. 60/404,192, filed on Aug. 16, 2002.

(51) Int. Cl.
B65G 15/64 (2006.01)
B05C 13/00 (2006.01)

(52) U.S. Cl. ................. 198/345.3; 198/474.1

(58) Field of Classification Search ............ 198/345.3, 198/465.1, 474.1, 867.11; 118/426, 500, 118/503; 221/179, 247, 260, 261
See application file for complete search history.

(56) References Cited

U.S. PATENT DOCUMENTS

| 3,150,765 A | 9/1964 | Ellis .......................... 198/131 |
| 3,587,829 A | 6/1971 | Sorenson .................... 198/131 |
| 4,669,416 A | 6/1987 | Delgado et al. ............ 118/503 |
| 4,859,498 A | 8/1989 | Yamaguchi ................. 118/500 |
| 5,007,534 A | 4/1991 | Tamaki et al. .............. 206/329 |
| 5,226,382 A | 7/1993 | Braden ....................... 118/406 |
| 5,337,893 A | 8/1994 | Nami et al. ................. 206/329 |
| 5,622,585 A | 4/1997 | Minowa et al. ............. 156/235 |
| 5,736,018 A | 4/1998 | Fellner et al. .............. 204/297 |
| 5,863,331 A | 1/1999 | Braden et al. .............. 118/261 |
| 5,973,285 A * | 10/1999 | Dietrich et al. ............ 209/573 |
| 6,093,249 A | 7/2000 | Curtin ........................ 118/500 |
| 6,164,448 A | 12/2000 | Schmutz et al. ............ 206/488 |
| 6,214,118 B1 | 4/2001 | Obana et al. ............... 118/712 |
| 6,258,400 B1 * | 7/2001 | Brehant et al. ............ 427/2.14 |

(Continued)

FOREIGN PATENT DOCUMENTS

JP   06-215991   8/1994

(Continued)

Primary Examiner—Douglas Hess
(74) Attorney, Agent, or Firm—Stoel Rives LLP

(57) ABSTRACT

Replaceable component carriers (40) are adapted to be freely floating in belt apertures (74) and have alignment features (160), such as conical holes (170), mated to features (162), such as tapered pins (184), in processing stations to temporarily hold a carrier (40) and its components (10), such as resistors, in a fixed position during various processes, such as termination. The carriers (40) include a rigid substructure (50) and a more elastic coating (60) to provide receiving holes (46) that can be adapted to hold particular components (10). The carriers (40) can be replaced without removing the belt (72), whenever differently shaped holes (46) are desired or become too worn to reliably handle components (10), thereby reducing damage risk, replacement cost, and operational down time of the belt (72).

22 Claims, 7 Drawing Sheets

U.S. PATENT DOCUMENTS

| | | |
|---|---|---|
| 6,485,567 B2 | 11/2002 | Obana et al. ............... 118/223 |
| 6,752,291 B2 * | 6/2004 | Saito ......................... 221/278 |
| 6,889,869 B2 * | 5/2005 | Hallin ........................ 221/223 |
| 7,066,314 B2 * | 6/2006 | Whiteman et al. ....... 198/345.3 |
| 2002/0017240 A1 | 2/2002 | Obana et al. ............... 118/712 |
| 2002/0020352 A1 | 2/2002 | Obana et al. ............... 118/712 |

FOREIGN PATENT DOCUMENTS

| | | |
|---|---|---|
| JP | 11-121307 | 4/1999 |
| JP | 2000-68686 | 3/2000 |
| JP | 2000-72108 | 7/2000 |

* cited by examiner

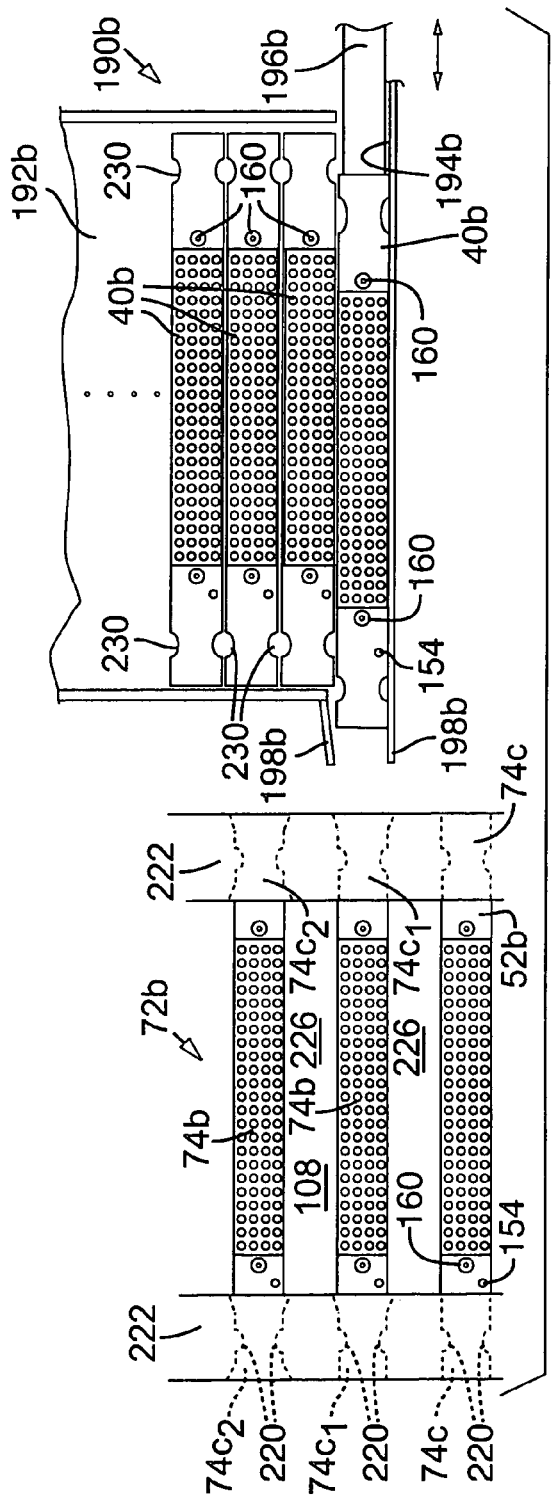
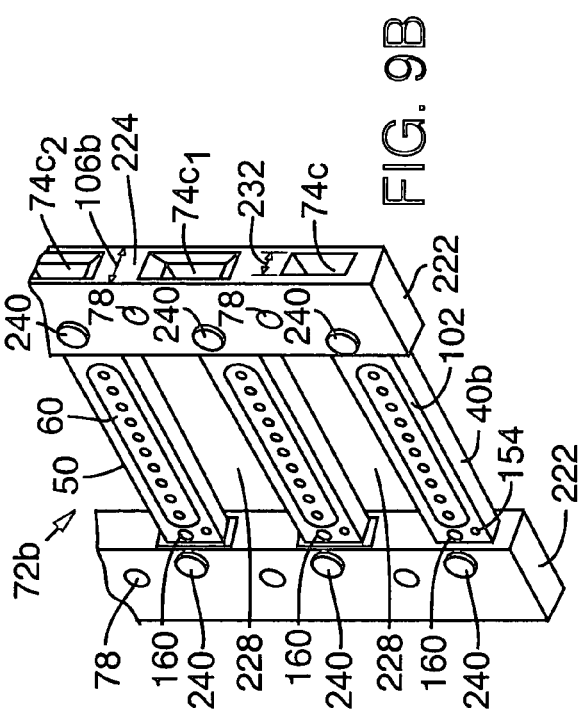
FIG. 9A
FIG. 9B

LOADING AND EXTRACTION OF MODULAR BELT CARRIERS OF ELECTRONIC COMPONENTS

RELATED APPLICATIONS

This patent application is a divisional of U.S. patent application Ser. No. 10/642,052, filed Aug. 15, 2003 now U.S. Pat. No. 7,066,314, which derives priority from U.S. Provisional Application No. 60/404,192, filed Aug. 16, 2002.

COPYRIGHT NOTICE

© 2003 Electro Scientific Industries, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR § 1.71(d).

TECHNICAL FIELD

This invention relates to microelectronic component or "chip" handling equipment and, more particularly, to a transfer belt and a chip carrier employed in a chip termination process.

BACKGROUND OF THE INVENTION

As computers and related equipment are made with greater capacity for more complex tasks, the internal components, in these computers and other components, have been downsized necessarily so that more and more components can be crowded into the same overall computer container. For example, the capacitor developed by Michael Faraday in the form of a Leyden jar has been reduced in size to that of a grain of salt. FIGS. 1A and 1B (generically FIG. 1) show exemplary respective components 10a and 10b (generically components 10). With reference to FIG. 1A, a typical capacitor component 10a is in the form of a rectangular parallelepiped of a length of 0.02 inch (0.51 mm), a width of 0.01 inch (25 mm), and a height of 0.03 inch (0.76 mm), e.g., over 33 of these components placed end to end, would measure almost one inch (25.4 mm).

Greater details of the external and internal structure of a typical component are shown in U.S. Pat. No. 5,226,382 (the '382 patent) of Braden. After the components 10 are first manufactured, their electrical contact surfaces at ends 12a (or the sides) of component 10a are coated with a thin layer of solder paste 14a that also covers small adjacent portions of the sides. The solder paste 14a, also called a "termination," contains ingredients that upon firing at elevated temperatures render it hard, easy to handle, and easy to reheat for a solder connection to copper strikes on a circuit board. The process of coating and firing components 10 is called a "termination" process. FIG. 1B shows multi-element or array component 10b that has multiple discrete lines of solder paste $14b_1$, $14b_2$, and $14b_3$ (generically 14b) applied across discrete electrical contact surfaces on end 12b (or the sides) in contrast to surfaces that can be coated on the entire end 12a or on any portion thereof.

FIG. 2A is plan view of a prior art carrier belt 20, and FIG. 2B is a cross-sectional view of a prior art carrier mask 22 that is molded onto carrier belt 20. With reference to FIGS. 2A and 2B, a conventional method of high-speed termination employs a continuous metal carrier belt 20 having a plurality of edges 23 that define laterally elongated apertures 24 formed therein that host a like plurality of masks 22 that are molded onto carrier belt 20 from silicon rubber and held by its molded flanges 30. The components 10 are loaded in vertical orientation in component holes 26 in masks 22 with their respective ends 12 (or sides) exposed above and below masks 22. The process employs drive spoke wheel holes 28 to advance the chip-loaded belt 20 to a dipper or "dauber" station where carrier belt 20 is slightly deformed to move one end 12 (or side) of components 10 into contact with termination paste and thereafter pass components 10 through an oven to set the paste before applying the paste to the other end 12 (or side) of the components 10 as disclosed in detail in the '382 patent.

Belt-based termination systems are commonly used in the passive electronic component industry. The cost of replacing belts 20 is a significant portion of the overall operating cost of belt-based termination systems. Each new type of geometry for components 10 may require differently sized masks to hold them. Manufacturers with a high mix of component geometries may require frequent belt changes. The cost of a new endless belt 20 with newly sized masks 22 is significant, and the downtime encountered in changing and tuning new belts 20 takes away from production time and adversely affects throughput and price. Taking belts 20 on and off for temporary belt substitutions can also damage the belts 20, making them useless or adversely affecting the quality of the parts processed on them.

Alternatively, employing the same mask 22 and belt 20 combination for a variety of component designs and sizes reduces the overall quality of the termination process primarily because sharp-edged components 10 tend to cut, shave, or otherwise fray the holding surfaces of the masks 22. Once such damage is done, slightly smaller components 10 or those having a slightly altered body shape are generally not held in masks 22 with sufficient force to avoid misalignment or loss of components 10. Masks 22 will also wear out even if they are used only to hold a single type of component 10, and neither masks 22 nor belts 20 are inexpensive to replace.

Re-masking of a belt 20 with new masks 22 presents its own set of problems. The costs of physically cutting away the old mask makes labor costs high and is a source of physical damage to the typically thin stainless steel belt 20 from an errant knife cut or unintentional creasing. Dissolving away the old mask is possible; however, the solvent and the rubber-solvent solutions are not inexpensive and are candidates for environmental problems in storing and discarding the material. Typically, used belts 20 are discarded.

In addition to mask wear issues, typical mask material must be sufficiently elastic to releasably hold components 10, but such elasticity is nearly incompatible with desired alignment tolerances for holding certain types of components 10, such as multiple element or array components 10b, within masks 22 for processing with greater precision and incompatible with increases in the number of rows 30 of holes 26.

Alignment of the belt 20 to processing stations is typically accomplished by aligning the drive holes 28 to the processing station. Unfortunately, this method of alignment necessitates tight alignment tolerances on the drive holes 28, drive wheels, pulleys, walking beams, and/or other belt translation devices, and processing stations and necessitates labor-consuming alignment of the processing stations to each other. Such alignment requirements increase wear, cost of the equipment, and setup and realignment time, and decrease equipment processing speed and overall throughput. Despite such expensive alignment procedures, components 10b often suffer from misalignment of respective pairs of contact pads $16b_1$, $16b_2$, and $16b_3$ (generically 16b) of solder paste 14b such that components 10b cannot be simultaneously functionally and squarely seated in a circuit board.

SUMMARY OF THE INVENTION

An object of the invention is, therefore, to provide a replaceable component carrier.

Another object of the invention is to provide such component carriers that can be independently aligned to one or more processing stations.

The present invention employs replaceable component carriers for retaining components in a modular belt during termination and other processes and during transport to and from processing stations. In some embodiments, the carriers are adapted to be snapped into transverse elongated apertures formed in the belt such that the carriers are freely floating in the apertures. Each of such carriers has two or more alignment features, such as spaced-apart conical holes, mated to features, such as tapered pins, in processing stations to temporarily hold the freely floating carrier and its components in a fixed position in the belt during various processes. In some embodiments, the carriers include a more rigid substructure to maintain alignment and process quality and a less rigid, more elastic covering that lines support holes such that they are suitable for receiving and holding the components during the various processes. The shape of the resulting elastic receiving holes can be adapted for receiving a particularly shaped component, and the carriers can quickly and easily be exchanged or replaced whenever differently shaped holes are desired or whenever the receiving holes become too worn to reliably handle components. The carriers can be replaced without removing the belt, thereby reducing the risk of damage to the belt, the cost of replacing the belt, and the operational downtime associated with removing or replacing the belt.

Additional objects and advantages of the invention will be apparent from the following detailed description of preferred embodiments thereof, which proceeds with reference to the accompanying drawings.

BRIEF DESCRIPTION OF THE DRAWINGS

FIG. 9A is a simplified fragmentary plan view of an alternative exemplary carrier attachment system.

FIG. 9B is a simplified fragmentary isometric view of an alternative carrier belt system that can employ an alternative embodiment of a removable carrier.

DETAILED DESCRIPTION OF PREFERRED EMBODIMENTS

Figure 1A:
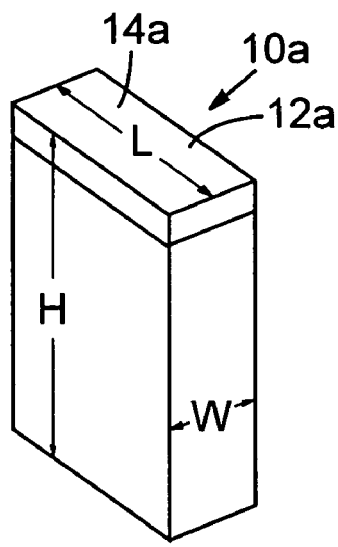
FIGS. 1A and 1B are isometric views of exemplary electronic components with at least one end coated with a termination paste.
Figure 1B:
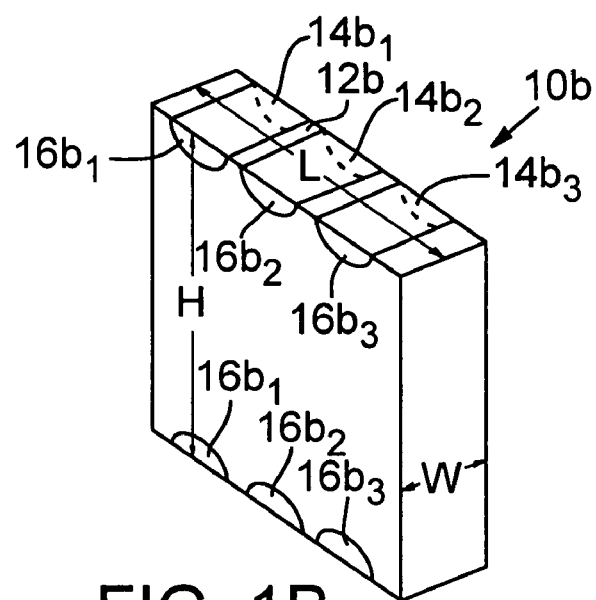
Figure 2A:
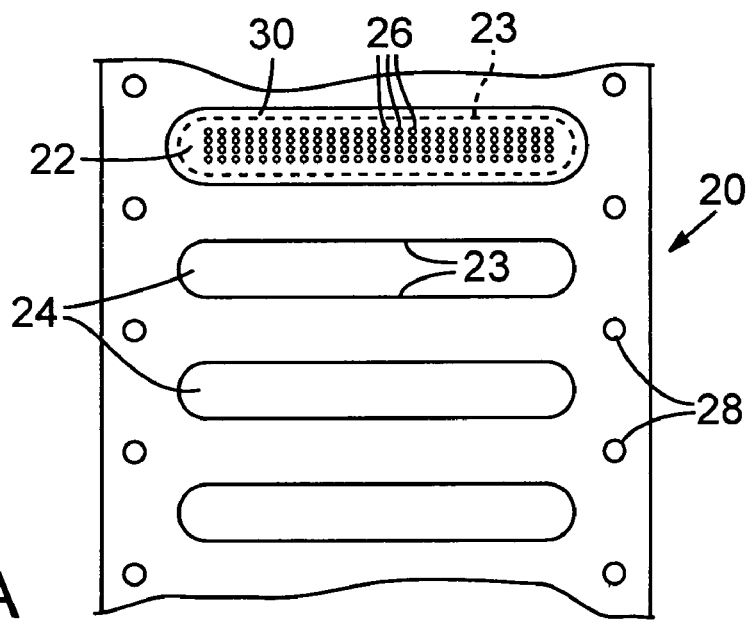
FIG. 2A is plan view of a prior art carrier belt.
Figure 2B:
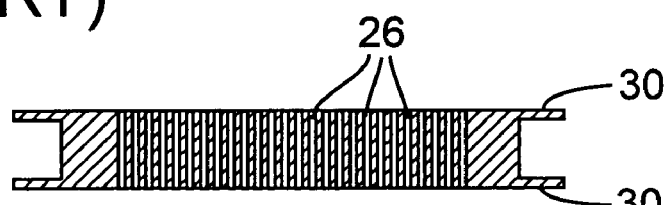
FIG. 2B is a cross-sectional view of a prior art carrier portion that is molded onto the carrier belt of FIG. 2A.
Figure 3A:
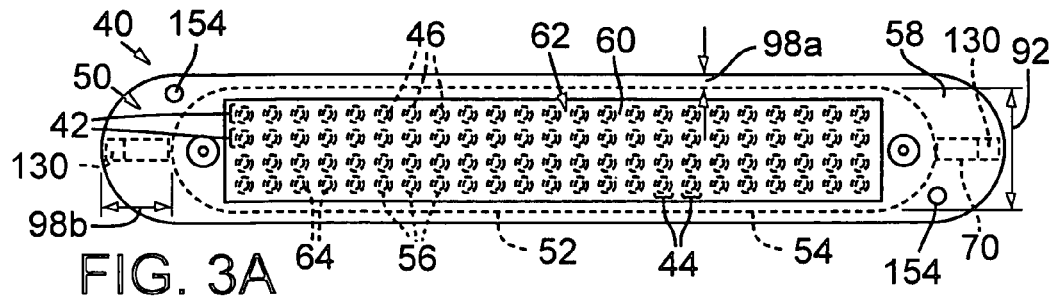
FIGS. 3A and 3B are respective plan and cross-sectional views of an embodiment of a replaceable carrier.
Figure 3B:
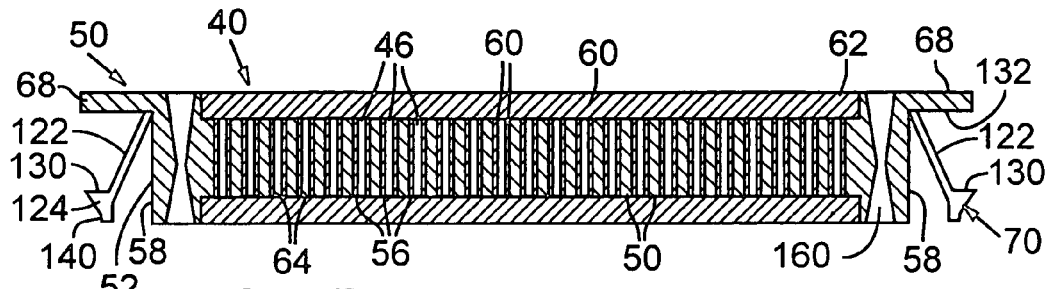
Figure 4A:
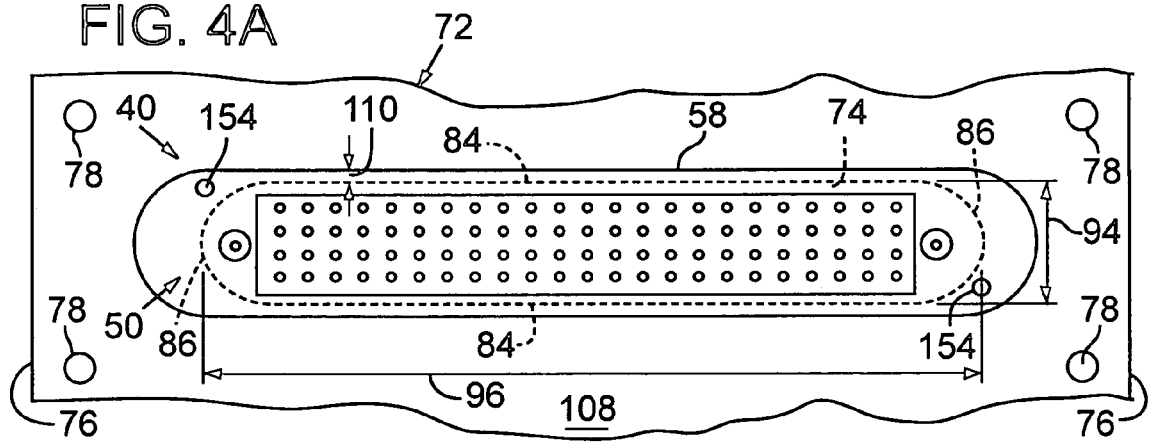
FIGS. 4A and 4B are respective plan and side elevation views of an exemplary removable carrier engaged with a carrier belt.
Figure 4B:
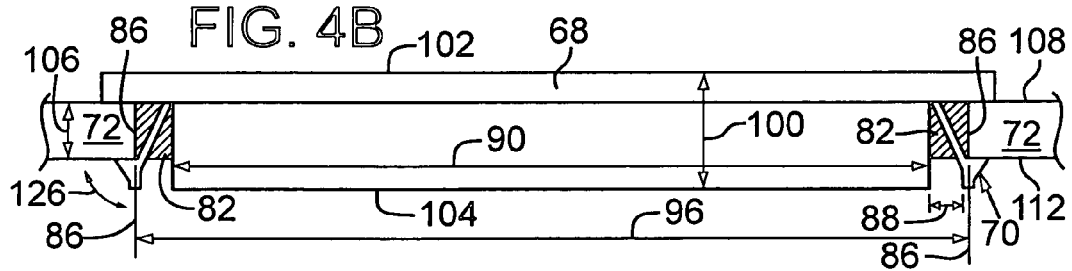
Figure 4C:
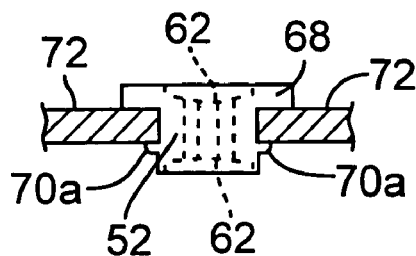
FIG. 4C is a side elevation view of a removable carrier having an alternative projection engaged with a carrier belt.

FIGS. 3A and 3B (generically FIG. 3) are respective plan and cross-sectional views of an embodiment of a replaceable component carrier 40 having multiple rows 42 and columns 44 of component receiving holes 46 for resiliently and firmly holding components 10 during transport to, and processing at, various processing stations, and FIGS. 4A and 4B (generically FIG. 4) are respective fragmentary plan and side elevation views of an embodiment of a replaceable component carrier 40 engaged with a carrier belt 72. With reference to FIGS. 3 and 4, a preferred embodiment of carrier 40 comprises a substantially rigid substructure 50 and a resilient or elastomeric coating material or layer 60. Carrier 40 may alternatively comprise only a single material sufficiently rigid to maintain hole alignment and sufficiently elastic to gently but firmly hold components 10 for processing.

Substructure 50 can be made of metal, such as aluminum, magnesium, or steel, or a hard plastic, such as a polyetherimide, with a Vicat softening temperature of above about 200 degrees Celsius, a broad chemical resistivity, and good thermal stability. The material of substructure 50 is preferably adapted to rigidly maintain alignments and distances between components 10. A preferred embodiment of substructure 50 includes a body 52 that has side walls 54 and end walls 58 and is perforated by rows 42 and columns 44 of support holes 56 that run between substantially parallel and symmetrically positioned recessed areas 62 on opposite sides of the body 52 of substructure 50. Recessed areas 62 and inside edges 64 of support holes 56 are preferably filled or coated with resilient coating layer 60, such as with an elastomer like silicon rubber, having an exemplary durometer value of 50 to 80 Shore A to form receiving holes 46 that have a narrower diameter than, and line the internal edges of, support holes 56. Resilient coating layer 60 is preferably thick enough to reduce the internal dimensions of support holes 56 to desired internal dimensions to capture and hold a component 10 therein with sufficient strength to pass undamaged or unmoved through several processing operations, including termination operations having a paste application step, while being sufficiently pliable or elastic to permit movement of components 10 when directed by a given processing station. The elastomer coating or layer 60 fills in the recessed area 62 about support holes 56 so that the elastomer material at the edges of support holes 56 is not damaged by the insertion of the components into the receiving holes 46.

Substructure 50 and resilient coating layer 60 can be sequentially produced by any number of injection molding processes as are well known to skilled practitioners. Skilled persons will appreciate that substructures 50 can be loaded into belts 72 (as later described), and coating layer 60 can be applied to substructures 50 while they are associated with belts 72; or, coating layer 60 can be applied to substructures 50 in a process where they are not supported by a belt 72. Resilient material 60 can also be made separately and then inserted into substructures 50. Skilled person will also appreciate that that substructures 50 and/or resilient material 60 can be color coded, such as with colorant additives or processes well-known to skilled practitioners, by sizes, shapes, or patterns of support holes 56 and receiving holes 46 to facilitate sorting or other identification-related processes.

Skilled persons will also appreciate that even though support holes 56 and receiving holes 46 are preferably coaxial, neither support holes 56 nor receiving holes 46 need be circular or have similar concentric shapes as shown. For example, support holes 56 may exhibit a diamond-shaped horizontal cross section, while receiving holes 46 may exhibit a square, rectangular, oval, slot or circular horizontal cross section and may be adapted to secure components 10 having specific rectangular parallelepiped or other configurations. Support holes 56 and receiving holes 46 may even have matched or unmatched irregular geometries.

Substructure 50 also includes a flange 68 and an engagement feature or projection 70 that cooperate to engage a carrier belt 72 that can be identical to, or different from, the prior art belt 20. A typical carrier belt 72 is flat, thin, and made from stainless steel, another metal, plastic, or another suitable material and is bordered by a pair of spaced-apart, parallel side edges 76. Carrier belt 72 typically includes a series of drive holes 78 formed along one or both side edges 76 for engagement with spokes of a drive wheel (not shown) that is used in a typical chip termination machine such as disclosed in the '382 patent. Carrier belt 72 also typically includes a plurality of elongated and parallel carrier-receiving areas or apertures 74 oriented transversely to an elongated axis of carrier belt 72 and lying centrally between side edges 76 and spaced evenly from drive holes 78, such that belt 72 is symmetrical on either side and from either direction. Apertures 74 preferably have an oval or elliptical perimeter to avoid sharp corners along internal edges 82 of belt 72 that could promote stress cracks, and are generally made by a stamp-cutting process wherein a cutter in the outline of an aperture 74 is brought downward against belt 72 as it passes underneath the cutter. Skilled persons will appreciate that apertures 74 need not be symmetrical or symmetrically positioned, and that apertures 74 can be positioned at angles with respect to side edges 76 of belt 72. Similarly, the elongated axis of apertures 74 may be oriented to be parallel to the elongated axis of carrier belt 72, and such apertures 74 could be grouped parallel to each other in sets.

The body 52 of carrier 40 is shaped to be similar to, but dimensionally smaller than, aperture 74 such that side walls 54 fit within internal edges 82. Side walls 54 are preferably adapted to be spaced away from internal edges 82 along one or both sides 84 and/or one or both ends 86 of aperture 74 by a gap 88 of about 0.3 to 2 mm (and preferably about 1 mm), for example, such that when carrier 40 is inserted into aperture 74, carrier 40 is able to move or "float" within the internal edges 82 of aperture 74. The shape of body 52 or aperture 74 can be designed to permit symmetrical or asymmetrical gaps along sides 84 and/or ends 86 and can be designed such that the gaps 88 along sides 84 and ends 86 can be the same or different. Exemplary lengths 90 and widths 92 of body 52 are respectively 75 mm and 8 mm, and exemplary lengths 94 and widths 96 of aperture 74 are respectively 76 mm and 9 mm.

While most dimensions of body 52 are smaller than the respective dimensions of aperture 74, the thickness (or height) 100 of carrier 40, defined by a distance between a top carrier surface 102 and a bottom carrier surface 104, is preferably greater that the thickness (or height) 106 of belt 72 or internal edges 82 such that top surface 102 of carrier 40 is located above belt 72 and bottom surface 104 of carrier 40 is located below belt 72 when carrier 40 is inserted into aperture 74. Typical belt heights 106 are about 0.5 mm to about 2 mm, and preferred carrier heights 100 are about 3 mm to about 6 mm. The larger height 100 of carrier 40 facilitates adaptation of a flange 68 that has a top surface that is preferably planar with top surface 102 and extends outwardly from body 52 so that flange 68 overhangs and preferably contacts top surface 108 of belt 72 whenever carrier 40 is positioned within aperture 74. Flange 68 is preferably attached to or integrated with substructure 50 and made from its same material. Flange 68 is also preferably continuous around the entire perimeter of body 52 and is preferably designed to have a symmetrical overlap 110 of top surface 108 around the perimeter of aperture 74 and/or a symmetrical overhang 98 around body 52. Skilled persons will appreciate that flange 68 may alternatively be discontinuous and may comprise, for example, numerous "teeth" that overlap top surface 108 along portions of sides 84 and/or ends 86 of aperture 74 or may simply comprise a minimum number of nubs 70a (FIG. 4C), such as one at each end 86, sufficient to prevent flange 68 from being pulled through aperture 74. Flange 68 may alternatively or additionally be designed to have dissimilar amounts of overhang 98a and 98b (generically 98) around body 52 at different positions around the perimeter of aperture 74, such as in proximity to the sides or ends of body 52.

In an alternative embodiment, belt 72 has height dimension 106 that extends between its respective top and bottom surfaces 108 and 112, and the carrier-receiving areas have one or more apertures 74 that extend through a vertical side of belt 72 and have height dimensions that are smaller than height dimension 106 of belt 72, such that body 52 or the entirety of carrier 40 can be inserted through a vertical side of belt 72. In such an embodiment, flange 68 and/or projection 70 are positioned about the ends of body 52 and may encompass both top and bottom surfaces 102 and 104, and these belt-engagement features may be replaced with or enhanced by a different type of belt-engagement feature that is generally horizontally positioned with respect to body 52 and that engages carrier attachment points such as holes or protrusions in internal walls or edges 82 of belt 72.

Carrier 40 preferably has a projection 70 that is attached to or integrated with substructure 50 or flange 68 and extends outwardly from body 52, is preferably made from its same material, and may permit carrier 40 to be "snapped" into aperture 74. Projection 70 is adapted to rest against bottom surface 112 of belt 72 and cooperates with flange 68 to engage belt 72 at sides 84 and/or ends 86 of aperture 74 to removably secure carrier 40 in aperture 74. Projection 70 may be continuous around the entire perimeter of body 52 or may be discontinuous and may comprise, for example, one or more "teeth" that overlap bottom surface 112 along portions of sides 84 and/or ends 86 of aperture 74 or may simply comprise a minimum number of nubs 70a (FIG. 4C), such as one at each end 86, sufficient to secure carrier 40 in aperture 74. Projection 70, if discontinuous, may have the same or different dimensions along different portions of body 52.

Figure 5:
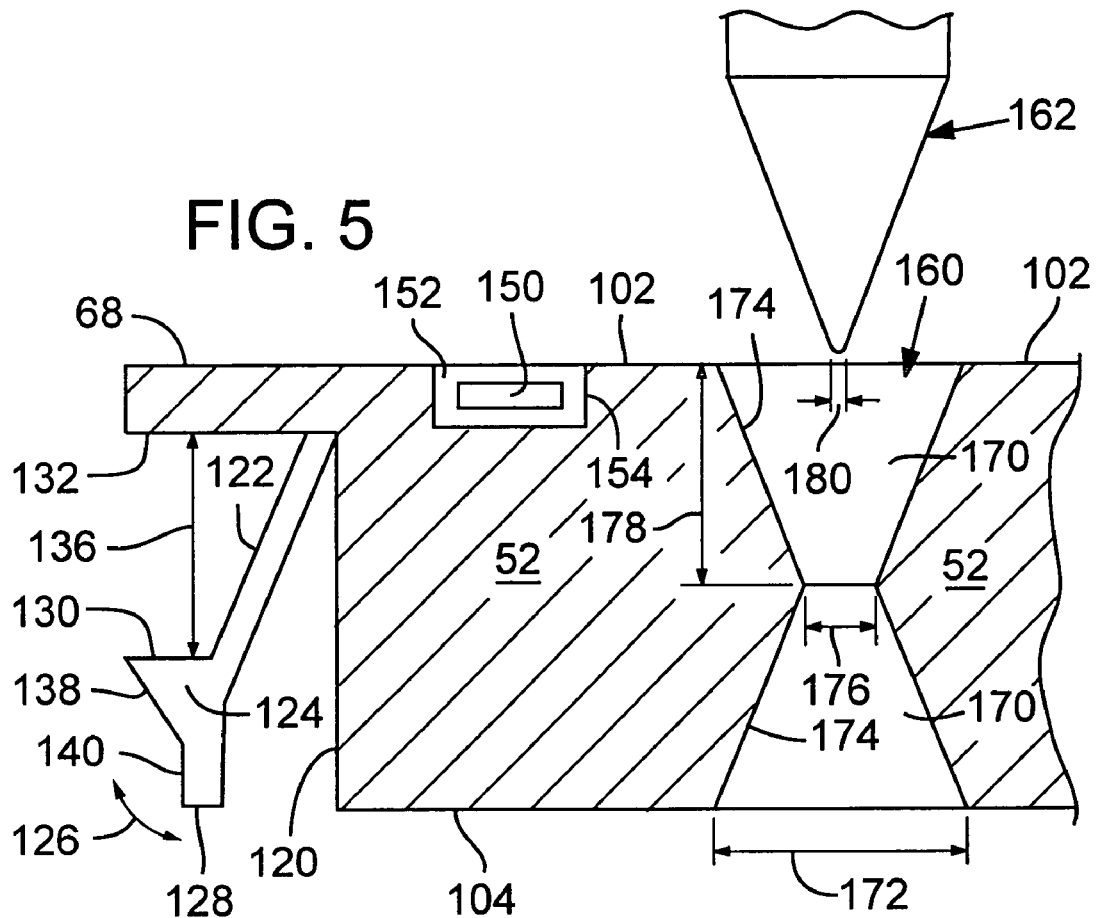
FIG. 5 is a fragmentary cross sectional view of an embodiment of a removable carrier showing details of an radio-frequency identification tag, an aperture-engagement projection, and mated alignment features between a carrier and a processing station.

FIG. 5 is a simplified fragmentary cross-sectional view of an embodiment of carrier 40 showing details of an exemplary projection 70, a radio-frequency identification tag (RFID tag) 150, and mated alignment features 160 and 162 between carrier 40 and a processing station. With reference to FIGS. 4 and 5, projection 70 comprises one or more flexible fastener tabs (tabs or tab projections 70), and most preferably one at each end 120 of body 52, that are integrated with substructure 50 and/or flange 68 near the junction between them. Each tab projection 70 preferably has an angled flexible arm 122 that allows generally radial movement 126 such that arm 122 can be pushed inward toward side wall 54 of carrier body 52, and arm 122 is "spring loaded" to return to about its original position or a position suitable for engaging bottom surface 112 of belt 72.

Arm 122 terminates in a hand 124 with a finger 128 that may be generally parallel to side wall 54 of body 52. Hand 124 preferably has a projection surface 130 that is generally parallel to bottom surface 132 of flange 68 such that it is adapted to engage bottom surface 112 of belt 72. Projection surface 130 is spaced apart from bottom surface 132 of flange 68 by a height 136 that is about the same as belt height 106. Hand 124 preferably also has an angled insertion surface 138 that is adapted to deflect away from the junction between top surface 108 and internal edge 82 to facilitate insertion of carrier 40 into aperture 74, and finger 128 preferably has a flat release surface 140 that facilitates compression of arm 122 toward body 52 to release carrier 40 from aperture 74. Skilled persons will appreciate that the dimensions, angles, and other features or surface characteristics of tab projection 70 can be modified to address specific belt or carrier features and to cooperate with specific tools or equipment, such as for inserting or removing carriers 40 from apertures 74.

With reference again to FIG. 5, a preferred embodiment of carrier 40 has one or more carrier-information or carrier-identification tags or devices, such as bar codes or RFID tags 150 embedded in an epoxy, silicon rubber, or other material layer 152 within respective recesses 154 in substructure 50. Carrier-information tags are discussed herein only by way of example to RFID tags 150 and permit products to be identified individually and/or by group characteristics. With respect to carriers 40, RFID tags 150 can be employed to identify different types of carriers 40, such as those adapted to hold different types or sizes of components 10, and to facilitate sorting or other tasks. In particular, RFID tags 150 would permit carriers 40 to be individually tracked, such as for the number of times a carrier 40 has been used, or the insertion force exerted to load or reverse components 10, and can indicate to a control system that a carrier 40 is becoming worn and needs to be replaced. Carrier-information tags can also be used for typical lifetime tracking of batches of carrier 40, such that each component need not be individually identified, and carrier-information tags can be used in addition to (or instead of) color coding of substructures 50 and/or resilient material 60.

Since RFID tags 150 are becoming inexpensive, skilled persons will appreciate that it could be advantageous to employ two cooperating or cross-identified RFID tags 150 per carrier 40 that are symmetrically positioned such that the exemplary carrier 40 can be inserted into aperture 74 in either of its two possible orientations and still have an RFID tag 150 in proximity to a single receiver or other sensor or information-gathering device, such as a bar-code reader. RFID tags 150 can be positioned, for example, within flange 68 or body 52, such as within a special hole within recessed area 62 and embedded in resilient coating material 60. Skilled persons will appreciate, however, that the positions and numbers of RFID tags 150 within carriers 40 can be adapted to suit the particular sizes and shapes of carriers 40 and the locations of the sensors employed to retrieve the information from the RFID tags 150.

Figure 6:
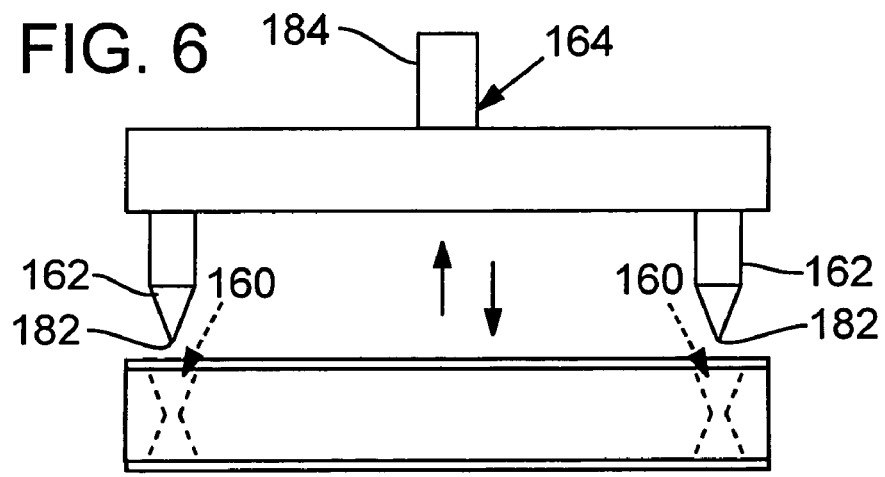
FIG. 6 is a simplified side elevation view of a processing station alignment fixture positioned over mated alignment features on a removable carrier.

FIG. 6 is a simplified side elevation view of a processing station alignment fixture 164 with a pair of alignment features 162 positioned over alignment features 160 on an exemplary carrier 40. With reference to FIGS. 5 and 6, preferred mated alignment features 160 and 162 are holes and pins. Preferably, alignment holes are positioned in carrier 40 and alignment pins are employed by a processing station, but skilled persons will appreciate that carriers 40 could be adapted to include pins and that processing stations could employ holes. Although alignment features 160 could be positioned in flange 68, alignment features 160 are preferably positioned on, in, or through body 52 of carrier 40 toward end walls 58. Alignment features 160 are also preferably positioned through at least part of rigid substructure 50 rather than solely through coating layer 60 to increase their useful life and long-term alignment precision against wear.

Each carrier 40 preferably includes at least two symmetrically positioned alignment features 160 to simplify carrier orientation requirements such as for loading carriers 40 into aperture 74. Alignment features 160 are preferably positioned along a central axis of carrier 40, but can be positioned at any locations on surfaces 102 or 104, preferably spaced apart by a large distance. Two or more alignment features 160 also facilitate precise alignment with processing stations and prevent lateral movement of carriers 40 within the plane of belt 72 within gaps 88 between body 52 and internal edges 82 of apertures 74 during sensitive processing operations. Such operation might include, for example, simultaneous application of multiple spaced-apart lines of termination paste across surfaces of array components 10b.

In an exemplary embodiment, each alignment feature 160 is implemented as a coaxial pair of connected conical alignment holes 170 having larger openings with a dimension 172 at surfaces 102 and 104 that narrow along angled walls 174 to a smaller dimension 176 at about a middle height 178 (about half of height 100) of carrier 40 to permit carrier 40 to be aligned from either side of surface 108 or 112 of belt 72. (Typically, components 10 are processed on both ends during a continuous belt revolution before components 10 are removed from carrier 40.) Dimension 172 is preferably a diameter that is at least about the dimension of total play of body 52 within aperture 74 or at least about two times the dimension of (equal) gaps 88, plus half of dimension 180 of tip 182 of an alignment pin that is a preferred embodiment of alignment feature 162. Neither the pin nor the hole need be tapered.

In a practical application, alignment fixture 164 can be lowered at a processing station under control of a guide rod 184 or other guide mechanism onto carrier 40 such that tips 182 engage respective alignment holes 170. However, an alignment fixture 164 could be urged against carrier 40 from below bottom belt surface 112. Alternatively, belt 72 can be pushed against a stationary alignment fixture 164 at a processing station. Processing stations may include, but are not limited to, carrier loading or unloading stations, component loading or unloading stations, paste applying stations, drying stations, component reversing stations, or carrier tracking stations.

Mating alignment features 160 of a carrier 40 floating in aperture 74 with alignment features 162 of processing stations have several advantages over conventional methods of aligning belts to processing stations. Floating carrier alignment permits relaxation of alignment tolerances between different processing stations and between them and belt drive mechanisms because each station aligns to carrier 40 independently. Independent alignment of carriers 40 also reduces torsion and other stresses on belt 72 between processing stations so that belts 72 last longer. Similarly, alignment tolerances of drive holes 78 can be relaxed, and wear at drive holes 78 becomes less significant so belts 72 can maintain a relaxed drive alignment for much longer periods of time, even though many generations of carriers 40 may be replaced. Belts 72 may also bend around pulleys, corners, or other deflection points or at processing stations, while rigid carriers 40 will maintain their shape. The rigid shape and independent alignment of carriers 40 permit component processing characteristics to be better optimized and more precise and permit greater uniformity of processed components 10 within and between batches. Such precise characteristics or uniformity may include, but are not limited to, paste thickness, flatness, and/or alignment or orthogonal seatability. Processed components 10 having greater uniformity reduce downstream production costs and increase reliability.

In an alternative embodiments, alignment features 162 of processing stations are substituted with vision-type positioning correction systems, such as those employed in the laser, semiconductor-processing, or other industries. In such embodiments, carrier alignment features 160 take the form of fiducials or other surface features that can be used by the positioning system to achieve very precise and very accurate positioning between processing station equipment and carriers 40 and/or their components 10. The fiducials could even be placed on the components 10. In such embodiments, combinations of mated alignment features 160 and 162 could additionally be designed to allow some freedom of movement between carrier processing stations and carriers 40 to provide "rough" alignment that could then be refined by the vision system.

Figure 7:
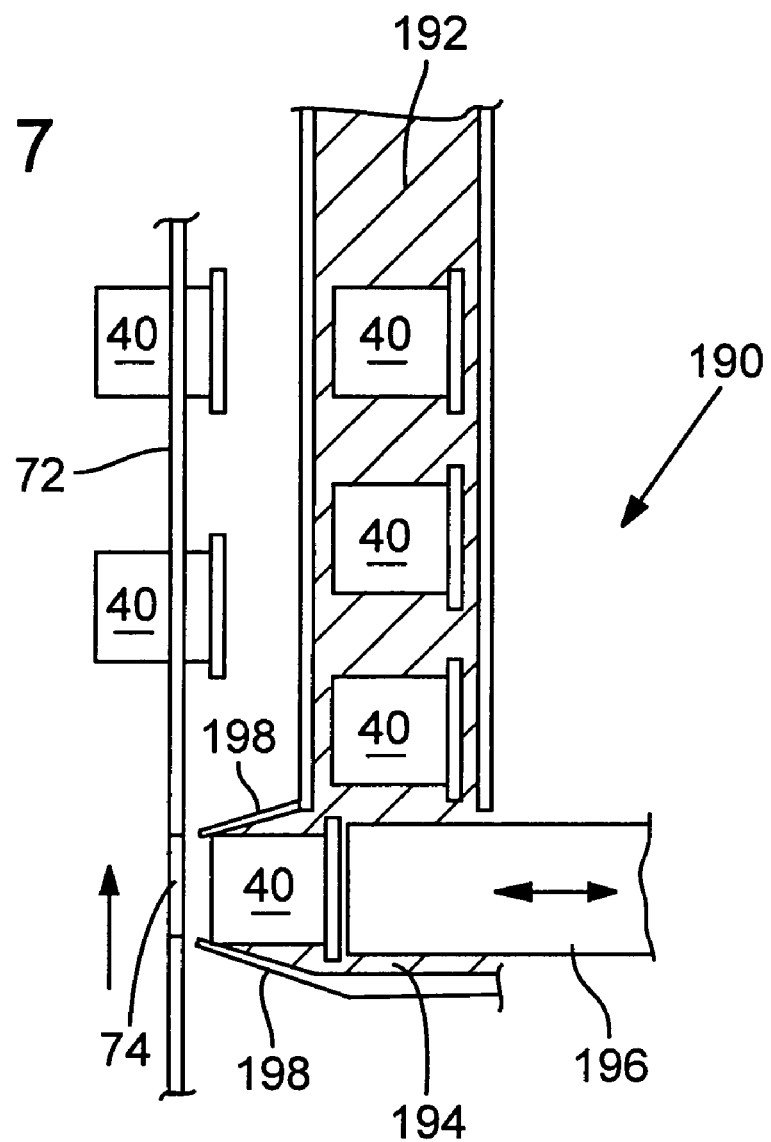
FIG. 7 is a simplified fragmentary cross-sectional view of an exemplary carrier attachment system.

FIG. 7 is a simplified fragmentary cross-sectional view of an exemplary carrier attachment or insertion system 190 that employs a supply vehicle, such as a carrier feeding tube 192, to feed carriers 40 into a carrier feeding chamber 194 where a linear actuator 196 pushes a carrier 40 through or along one or more spring-loaded carrier guides or carrier arm guides 198 that may compress projections 70 or their arms 122 toward body 52 and guide body 52 into aperture 74. Feeding tube 192 preferably has cross-sectional area dimensions in proximity to feeding chamber 194 to permit only a single carrier 40 to enter feeding chamber 194 at a given time. Skilled persons will appreciate that tube 192 and chamber 194 of carrier attachment system 190 need not be vertical and could be angled or generally horizontal and that other types of feed systems and actuators could be employed. Skilled persons will also appreciate that tube 192 need not limit introduction to chamber 194 to one carrier 40 at a time, and several carriers 40 could be loaded simultaneously with multiple actuators 196 or multiple pronged actuators into respective apertures 74 in belt 72.

Figure 8:
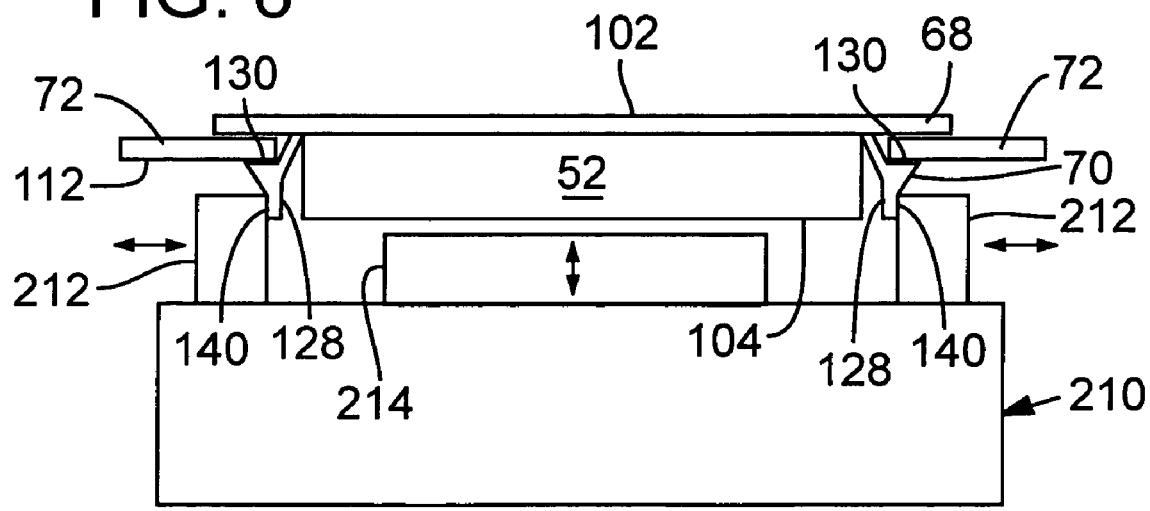
FIG. 8 is a simplified side elevation view of an exemplary carrier extraction system.

FIG. 8 is a simplified side elevation view of an exemplary carrier extraction system 210 that employs actuated clamps 212 to compress flat surfaces 140 of fingers 128 of projection arms 122 toward body 52 of carrier 40 to release surfaces 130 from engagement with surface 112 of belt 72. Substantially simultaneously or subsequently, actuator 214 pushes bottom surface 104 of carrier 40 to release carrier 40 from engagement with internal edges 82 of aperture 74 of belt 72. Skilled persons will appreciate that carrier extraction system 210 need not be horizontal and could be angled, generally vertical, or facing downwards so that gravity can assist carrier removal and that other types of actuators could be employed. In an alternative embodiment, actuated clamps 212 are angled inwardly to meet angled insertion surface 138 and actuator 214 is eliminated.

FIG. 9A is a simplified fragmentary cross-sectional view of an alternative exemplary carrier attachment system 190*b* for loading alternative types of replaceable carriers 40*b* onto alternative belts 72*b* having alternative carrier attachment features 220 for association with alternative carriers 40*b*, and FIG. 9B is a simplified fragmentary isometric view of an alternative belt 72*b* that employs such an alternative embodiment of carrier 40*b*. With reference to FIGS. 9A and 9B (collectively FIG. 9), belt 72*b* may have a uniform solid thickness including and between drive strips 222 or may only have bracing segments 226 with a smaller height dimension than that of drive strips 222, or drive strips 222 may be completely distinct and be connected only by, and having spaces 228 between, carriers 40*b*, such as shown in FIG. 9B. For convenience, reference numerals may be used without letter identifiers to refer to parts generically.

Carrier attachment features 220 of belts 72*b* may include, but are not limited to, apertures 74*b* between pairs of drive strips 222, and apertures 74*c* that extend through vertical sides 224 of belts 72*b* or their drive strips 222. Apertures 74*c* have height dimensions 232 that are smaller than height dimension 106*b* of drive strips 222, such that body 52*b* or the entirety of carrier 40*b* can be inserted through vertical side 224 of belt 72*b*. Apertures 74*c* are about the same size as or slightly larger than respective dimensions of the ends of carriers 40*b*, but may have flared openings in one or more dimensions to facilitate entry of carriers 40*b*. With reference to FIG. 9, which depicts several exemplary embodiments, aperture 74*c* has generally parallel openings at both sides of both drive strips 222. Aperture $74c_1$ has a flared opening along only side dimensions and only on sides of drive strips 222 that are oriented toward carrier attachment system 190*b*. Aperture $74c_2$ has a flared opening along both side and height dimensions and on both sides of drive strips 222 so that drive strips 222 are symmetrical from side to side and top to bottom so that they are easier to install. Skilled persons will appreciate that apertures 74*c* in the remote drive strip need not extend all the way through the second side of belt 72*b*, or apertures 74*c* may instead take the form of open-topped troughs that may or may not extend through either side of either drive strip 222, such that carriers 40*b* may be dropped into a secured position within belt 72*b*.

Carrier attachment features 220 of belts 72*b* may also include, but are not limited to, bumps, small additional apertures or pits, or other features within or in proximity to apertures 74*b* for engagement with mated engagement features 230, such as projections, bumps, small additional apertures or pits, or other features on carriers 40*b*. Such carrier attachment features may be integrated with the internal side walls of apertures 74*c* as shown, but they may alternatively or additionally be positioned on or within the top and/or bottom surfaces of apertures 74*c*. Similarly, mated engagement features 230 can be positioned alternatively or additionally on or within the top and/or bottom surfaces 102 and 104 of carriers 40b.

Alternatively or additionally, carriers 40b may include flange 68 and/or projection 70 positioned about the ends of body 52 and may encompass both top and bottom surfaces 102 and 104. In addition to carrier attachment features 220 and mated engagement features 230 that are integrated respectively with belts 72b and carriers 40b, discrete attachment devices, such as securing pins 240, may alternatively or additionally be employed to secure carriers 40b to belt 72b.

In practice, carrier insertion system 190b may employ, for example, processes and equipment similar to that of carrier insertion system 190, such as carrier feeding tube 192b, carrier feeding chamber 194b, linear actuator 196b, and carrier arm guides 198b except that carriers 40b would be oriented differently and actuator 196b would exert force on a vertical side rather than at the top of carrier 40b. Extraction can be automatically accomplished with an actuator similar to actuator 196b.

Figure 10:
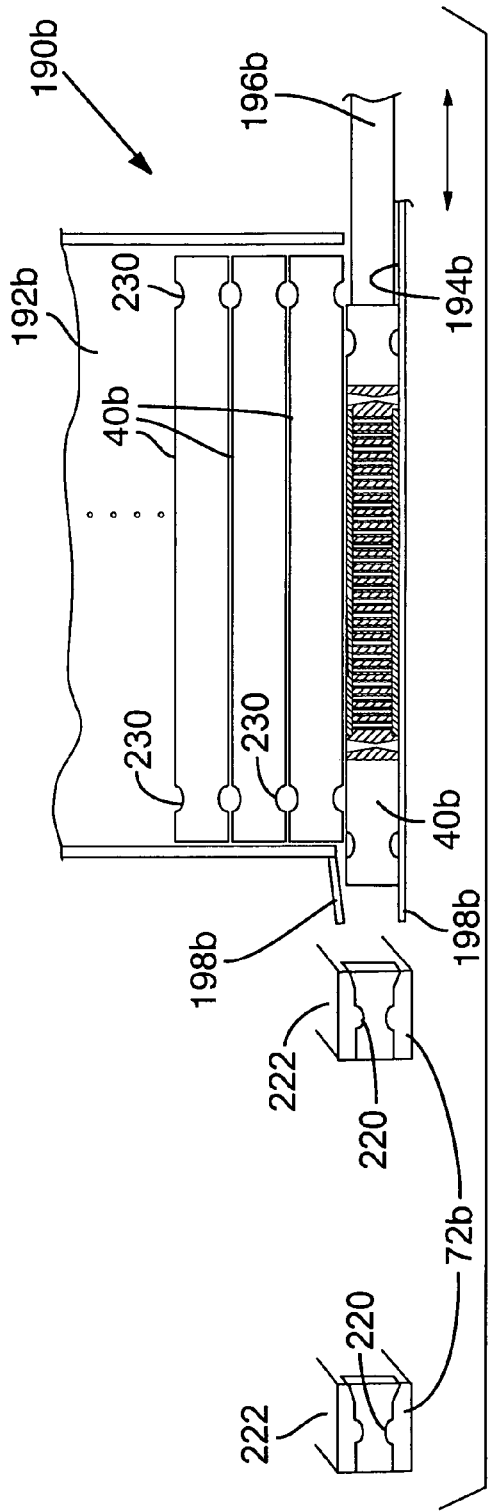
FIG. 10 is a simplified part side elevation and part isometric fragmentary cross-sectional view of an alternative exemplary carrier attachment system.

FIG. 10 is a simplified part side elevation and part isometric fragmentary cross-sectional view of an alternative exemplary carrier attachment system 190b. A major difference between the embodiments in FIGS. 9 and 10 is the orientation of carriers 40b in feeding chambers 194b. Such orientation can be controlled by adapting the design of feeding tubes 192b to present carriers 40b to chambers 194b in the desired orientation. Skilled persons will also note that belt 72b runs generally parallel to carrier attachment system 190b toward the insertion point in FIG. 9, but belt 72b runs generally orthogonal to carrier attachment system 190b toward the insertion point in FIG. 10.

Figure 11:
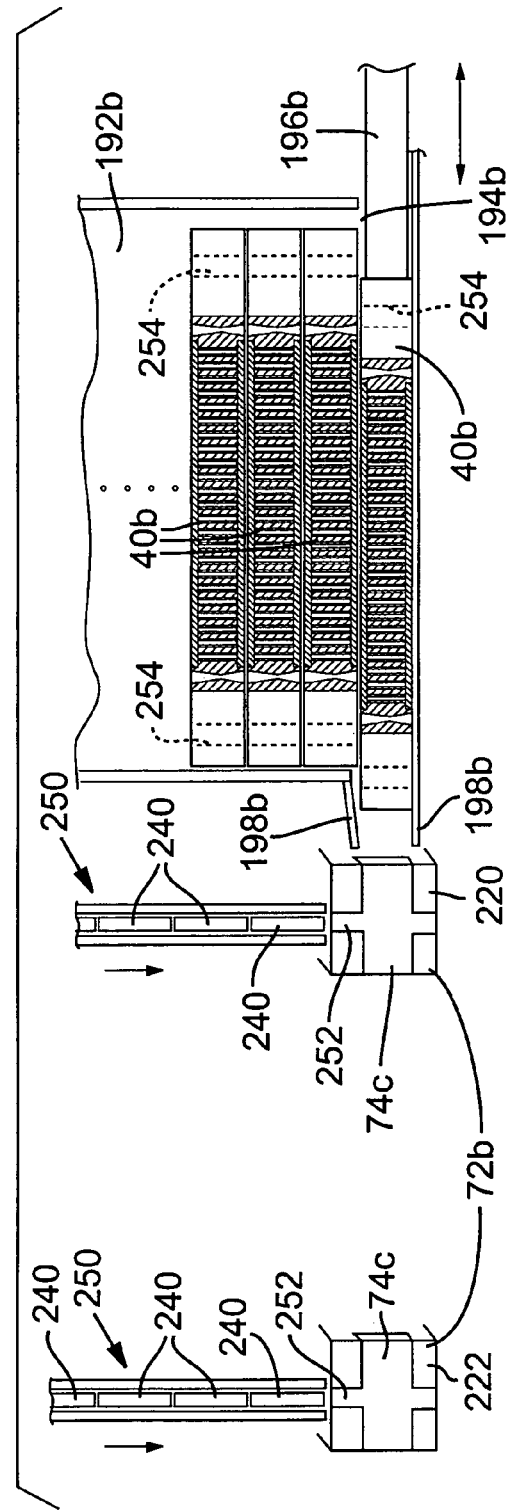
FIG. 11 is a simplified part side elevation and part isometric fragmentary cross-sectional view of an alternative exemplary carrier attachment system that employs securing pins.

FIG. 11 is a simplified part side elevation and part isometric fragmentary cross sectional view of an alternative exemplary carrier attachment system 190b that employs securing pins 240. Carrier insertion system 190b of FIG. 11 employs similar processes and equipment to that of carrier insertion system 190b of FIG. 10; however, carrier insertion system 190b of FIG. 11 additionally employs one or more securing pin insertion systems 250. Securing pin insertion systems 250 may employ gravity feeds or actuators (not shown) to introduce securing pins 240 through belt pin holes 252 into carrier pin holes 254. Belt pin holes 252 may be flared toward surface 108 of belt 72b and/or carrier pin holes 254 may be flared toward surface 102 of carrier 40b to facilitate insertion of securing pins 240 through them. Belt pin holes 252 may or may not have symmetrical openings on the belt faces and may not extend all the way through to the bottom of belt 72b. Belt pin holes 252 and securing pins 240 may be circular or employ a variety of different shapes matching shapes or mated features. The securing pins 240 can be easily removed with an actuator, particularly in embodiments where belt pin holes 252 extend all the way through belt 72b.

Figure 12:
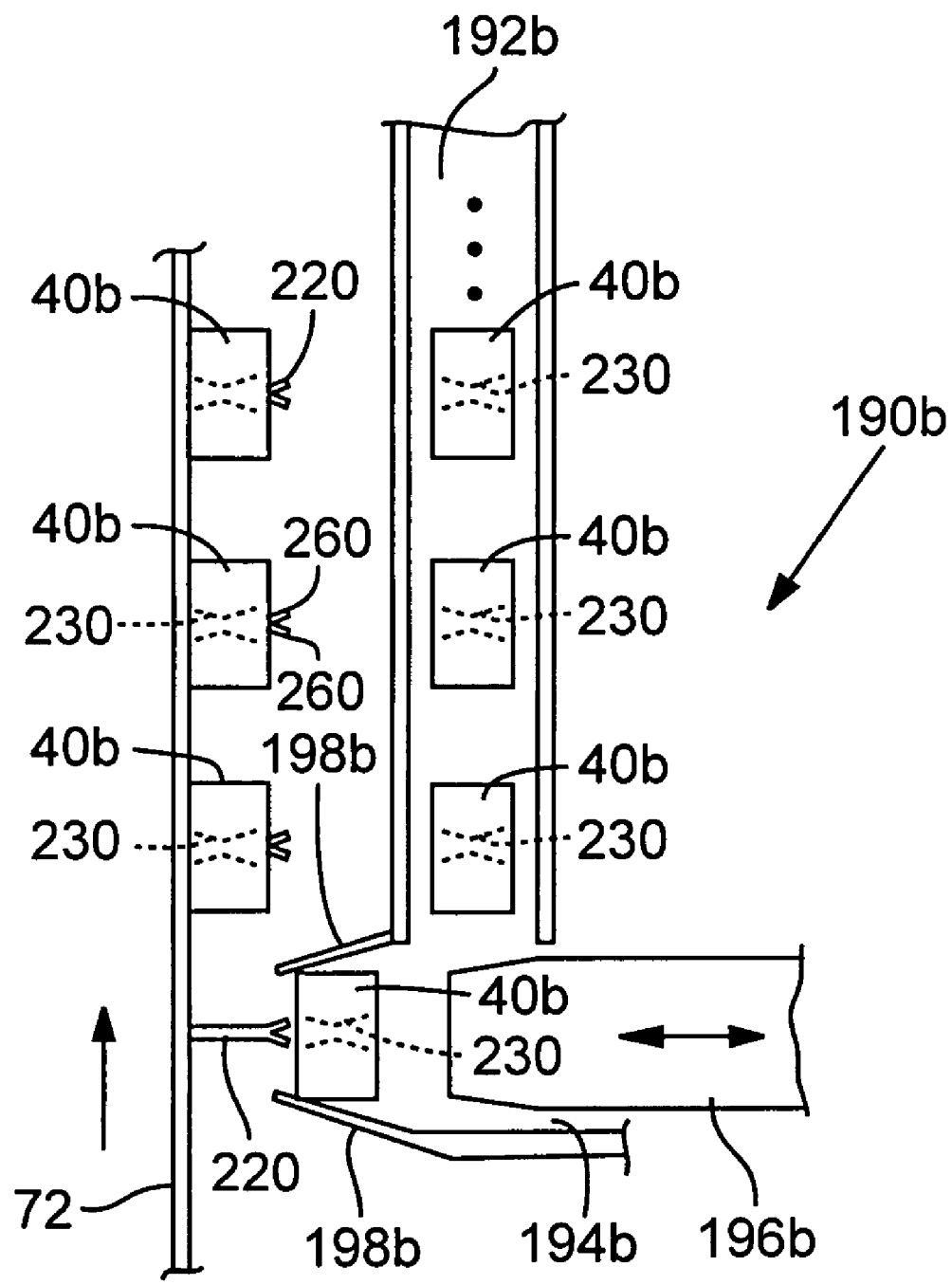
FIG. 12 is a simplified side elevation cross-sectional view of an alternative exemplary carrier attachment system that employs an alternative type of belt engagement feature.

FIG. 12 is a simplified side elevation cross sectional view of an alternative exemplary carrier attachment system 190b that employs alternative types of belt attachment features 220 that cooperate with mated engagement features 230 to secure carriers 40b to belt 72b. With reference to FIG. 12, belt attachment features 220 include projections with tabs 260, and mated engagement features 230 comprise receiving apertures that are adapted to receive the projections. In a preferred embodiment, tabs 260 are divergent and reside at the ends of the projections and at a height from belt 72b such that they protrude above surface 102 or 104 of carrier 40b when it is secured to belt 72b. The receiving apertures may be flared or take on a variety of shapes as discussed with other features in embodiments previously discussed.

Carrier insertion systems 190 and carrier extraction systems 210 may be positioned along a continuous belt loop of other processing stations and may be fully automated to extract and replace carriers 10 in response to information received from RFID tags 150 or from software tracking algorithms in a processing station or machine employing carriers 40. Apertures 74 can also be individually tagged or otherwise identified or can be known as being between apertures containing identified carriers 40 so that empty apertures 74 can be identified if desirable.

In an alternative embodiment, belts 72 contain replaceable belt segments that each include one or more carriers 40 or masks 22. The belt segments could be held together by removable pins or other known attachment means. The pins can be removed and belt segments containing worn carriers 40 or masks 22 could be easily popped out and replaced.

Skilled persons will appreciate with respect to belt-assisted termination or other microcomponent manufacturing processes that components 10 can be seated centrally (neither end 12 of component 10 protruding much, if at all, from receiving holes 46), and carriers 40 can be extracted from belt 72 while the carriers 40 are holding the components 10. The filled carriers 40 could then be inserted into another belt that uses a different speed and/or takes the components 10 through a different process. The filled carriers 40 could alternatively be inserted into a cassette for a particular (bottleneck) process such as paste drying and then reinserted in a belt 72 for second end processing, for example, or the filled carriers 40 could be inserted into a cassette for storage, transport, or sale.

It will be obvious to those having skill in the art that many changes may be made to the details of the above-described embodiments of this invention without departing from the underlying principles thereof. The scope of the present invention should, therefore, be determined only by the following claims.

The invention claimed is:

1. A carrier loading system for securing component carriers to a belt having carrier attachment features for association with the carriers and having drive features such that the belt is adapted to be moved by one or more belt translation mechanisms to pass through one or more electronic component processing stations, each carrier having multiple receiving holes, each receiving hole having a resilient edge that is adapted to resiliently hold one of the electronic components, comprising:

a feed chamber;

a supply vehicle for delivering the carrier to the feed chamber;

an exit guide positioned in proximity to the feed chamber and adapted to direct the carrier into association with a carrier attachment feature positioned in proximity to the exit guide; and an actuator adapted to move the carrier along the exit guide from the feed chamber into association with the carrier attachment feature.

2. The carrier loading system of claim 1 in which the carrier attachment feature comprises a belt aperture and in which the carrier includes a body having perimeter dimensions that are smaller than corresponding dimensions of the belt aperture such that the body is adapted to sit within the belt aperture and have some movement within a plane of the belt while being securely supported by the belt.

3. The carrier loading system of claim 1 in which the carrier attachment feature comprises a belt aperture and in which the carrier comprises:
- a flange connected to or integrated with a carrier body with top and bottom surfaces through which the receiving holes axially extend, the flange extending outward from the body and having a flange dimension adapted to overhang an internal edge of the belt, such that the actuator is adapted to cause the flange to come into contact with a surface of the belt; and
- a projection that is adapted in cooperation with the flange to engage the internal edge of the belt to brace the carrier within the belt, such that the exit guide is adapted to suppress the projection to facilitate movement of the body of the carrier into the belt aperture.

4. The carrier loading system of claim 3 in which the projection has a surface that is parallel to the flange.

5. The carrier loading system of claim 3 in which the projection comprises a nub.

6. The carrier loading system of claim 3 in which the projection comprises a tab having an engagement surface that is adapted for engaging the internal edge and an opposing angled slide surface adapted for facilitating insertion of the carrier into the aperture.

7. The carrier loading system of claim 3 in which the projection comprises a tab having a major axis angled away from the body.

8. The carrier loading system of claim 7 in which the tab is attached to or integrated with the body.

9. The carrier loading system of claim 7 in which the tab is attached to or integrated with the flange.

10. The carrier loading system of claim 1 in which the supply vehicle comprises a conduit having cross-sectional area dimensions in proximity to the feed chamber adapted to permit only a single carrier to enter the feed chamber at a given time.

11. The carrier loading system of claim 1 in which the supply vehicle comprises a conduit having cross-sectional area dimensions in proximity to the feed chamber adapted to maintain orientation of carriers within the conduit such that a particular face of each carrier is presented to the actuator.

12. A method for automated loading of carriers onto belts having a carrier attachment feature for association with the carriers and having drive features such that the belt is adapted to be moved by one or more belt translation mechanisms to pass through one or more electronic component processing stations, each carrier having multiple receiving holes that each have a resilient edge that is adapted to resiliently hold one of the electronic components, comprising:
- supplying a carrier to a feed chamber;
- expelling the carrier in a predetermined orientation from the feed chamber; and
- guiding the carrier in a predetermined orientation into association with the carrier attachment feature of the belt.

13. The method of claim 12 in which the carrier attachment feature comprises a belt aperture and in which the carrier comprises a flange connected to or integrated with a carrier body with top and bottom surfaces through which the receiving holes axially extend, the flange extending outward from the body and having a flange dimension adapted to overhang an internal edge of the belt, such that the flange comes into contact with a surface of the belt when the carrier is expelled and guided, and in which the carrier comprises a projection that is adapted in cooperation with the flange to engage the internal edge of the belt to brace the carrier within the belt, such that guiding the carrier suppresses the projection to facilitate movement of the body of the carrier into the belt aperture.

14. The method of claim 13 in which the projection has a surface that is parallel to the flange.

15. The method of claim 13 in which the projection comprises a nub.

16. The method of claim 13 in which the projection comprises a tab having an engagement surface that is adapted for engaging the internal edge and an opposing angled slide surface adapted for facilitating insertion of the carrier into the aperture.

17. The method of claim 13 in which the projection comprises a tab having a major axis angled away from the body.

18. The method of claim 17 in which the tab is attached to or integrated with the body.

19. The method of claim 17 in which the tab is attached to or integrated with the flange.

20. The method of claim 12 in which the carrier attachment feature comprises a belt aperture and in which the carrier includes a body having perimeter dimensions that are smaller than corresponding dimensions of the belt aperture such that the body is adapted to sit within the belt aperture and have some movement within a plane of the belt while being securely supported by the belt.

21. The method of claim 12 in which supplying the carrier to the feed chamber further comprises:
- employing a conduit having cross-sectional area dimensions in proximity to the feed chamber adapted to permit only a single carrier to enter the feed chamber at a given time.

22. The method of claim 12 in which supplying the carrier to the feed chamber further comprises:
- employing a conduit having cross-sectional area dimensions in proximity to the feed chamber adapted to maintain orientation of carriers within the conduit such that a particular face of each carrier is presented to an actuator adapted to move the carrier from the feed chamber into association with the carrier attachment feature of the belt.

* * * * *